(12) United States Patent
Morthier (10) Patent No.: US 12,142,894 B2
(45) Date of Patent: Nov. 12, 2024

(54) LASER COMPRISING A LOOP RESONATOR

(71) Applicants: IMEC VZW, Leuven (BE); Universiteit Gent, Ghent (BE)

(72) Inventor: Geert Morthier, Drongen (BE)

(73) Assignees: Imec vzw, Leuven (BE); Universiteit Gent, Ghent (BE)

( * ) Notice: Subject to any disclaimer, the term of this patent is extended or adjusted under 35 U.S.C. 154(b) by 509 days.

(21) Appl. No.: 17/652,765

(22) Filed: Feb. 28, 2022

(65) Prior Publication Data

US 2022/0285907 A1  Sep. 8, 2022

(30) Foreign Application Priority Data

Mar. 3, 2021  (EP) .................................. 21160429

(51) Int. Cl.
*H01S 5/026* (2006.01)
*H01S 5/10* (2021.01)
*H01S 5/125* (2006.01)

(52) U.S. Cl.
CPC .......... *H01S 5/0265* (2013.01); *H01S 5/1071* (2013.01); *H01S 5/125* (2013.01)

(58) Field of Classification Search
CPC .................................................... H01S 5/1071
See application file for complete search history.

(56) References Cited

U.S. PATENT DOCUMENTS

| 9,778,493 | B1 | 10/2017 | Krishnamoorthy et al. |
| 2016/0025926 | A1 | 1/2016 | Taylor |
| 2018/0102625 | A1* | 4/2018 | Brès ...................... H01S 3/0675 |

OTHER PUBLICATIONS

European Search Report and Written Opinion, Application No. EP21160429.3, mailed Aug. 5, 2021, 10 pages.
Braga, Alexandre, Jean-Claude Diels, Ravinder Jain, Ronald Kay, and Li Wang. "Bidirectional mode-locked fiber ring laser using self-regenerative, passively controlled, threshold gating." Optics letters 35, No. 15 (2010): 2648-2650.

(Continued)

*Primary Examiner* — Tuan N Nguyen
(74) *Attorney, Agent, or Firm* — McDonnell Boehnen Hulbert & Berghoff LLP (57) ABSTRACT

Example embodiments relate to lasers that include loop resonators. One example laser includes a loop resonator forming a closed loop light path. The loop resonator includes an optical gain medium configured to lase. The loop resonator is configured to, during lasing, present a pair of modes: a mode of light propagating in a clockwise direction in the closed loop light path of the loop resonator (termed CW mode) and a mode of light propagating in a counterclockwise direction in the closed loop light path of the loop resonator (termed CCW mode). The laser also includes a first light output configured to output laser light from the laser. Additionally, the laser includes an optical power modulating unit. The optical power modulation unit is configured to modulate an optical power of the CW mode of the loop resonator and an optical power of the CCW mode of the loop resonator.

20 Claims, 6 Drawing Sheets

(56) References Cited

OTHER PUBLICATIONS

Kim, Doo Gun, Geum-Yoon Oh, Tae-Kyeong Lee, Seon Hoon Kim, Hyun Chul Ki, Jung Woon Lim, Hwe Jong Kim, Boo-Gyoun Kim, Nadir Dagli, and Young-Wan Choi. "Direct intensity modulation of a rectangular ring laser with bidirectional lasing characteristics." Optics Communications 284, No. 19 (2011): 4473-4476.

Morthier, Geert, and Pauline Mechet. "Theoretical and experimental analysis of unidirectionality of asymmetrically coupled semiconductor ring or disk lasers." In Physics and Simulation of Optoelectronic Devices XXII, vol. 8980, pp. 166-173. SPIE, 2014.

Sacher, Wesley D., William MJ Green, Solomon Assefa, Tymon Barwicz, Steven M. Shank, Yurii A. Vlasov, and Joyce KS Poon. "Controlled coupling in silicon microrings for high-speed, high extinction ratio, and low-chirp modulation." In CLEO: 2011-Laser Science to Photonic Applications, pp. 1-2. IEEE, 2011.

Ren, Jinhan, Yuzhou GN Liu, Midya Parto, William E. Hayenga, Mohammad P. Hokmabadi, Demetrios N. Christodoulides, and Mercedeh Khajavikhan. "Unidirectional light emission in PT-symmetric microring lasers." Optics express 26, No. 21 (2018): 27153-27160.

Smolyakov, Gennady A., and Marek Osinski. "High-speed modulation analysis of strongly injection-locked semiconductor ring lasers." IEEE Journal of Quantum Electronics 47, No. 11 (2011): 1463-1471.

Coomans, Werner, Lendert Gelens, Guy Van der Sande, G. Mezosi, M. Sorel, Jan Danckaert, and Guy Verschaffelt. "Semiconductor ring lasers coupled by a single waveguide." Applied Physics Letters 100, No. 25 (2012): 251114.

Ye, Tong, Yifeng Zhou, Cishuo Yan, Yuntao Li, and Yikai Su. "Chirp-free optical modulation using a silicon push-pull coupling microring." Optics letters 34, No. 6 (2009): 785-787.

Chang, Chia-Ming, Po Dong, Chengcheng Gui, and Guilhem de Valicourt. "Low-chirp push-pull microring modulators." In Optical Fiber Communication Conference, pp. Th4H-2. Optical Society of America, 2016.

Sacher, Wesley D., Michael L. Davenport, Martijn JR Heck, Jared C. Mikkelsen, Joyce KS Poon, and John E. Bowers. "Hybrid silicon ring laser with unidirectional emission." In 2015 Conference on Lasers and Electro-Optics (CLEO), pp. 1-2. IEEE, 2015.

* cited by examiner

LASER COMPRISING A LOOP RESONATOR

CROSS-REFERENCE TO RELATED APPLICATIONS

The present application is a non-provisional patent application claiming priority to European Patent Application No. EP 21160429.3, filed Mar. 3, 2021, the contents of which are hereby incorporated by reference.

FIELD OF THE DISCLOSURE

The present disclosure relates, in general, to a laser and a method. More particularly, the present disclosure relates to a laser and a method for creating laser pulses.

BACKGROUND

In optical systems, e.g. optical communication systems, a laser may create laser pulses to be propagated through an optical medium, e.g. an optical fiber.

Laser pulses may be created in different ways. A laser diode may be directly modulated, wherein the drive current of the laser diode is modulated to create the laser pulses. Alternatively, external modulation may be used, wherein continuous wave light from a laser passes through an external optical modulator outside the laser, wherein the external optical modulator modulates the continuous wave light into laser pulses.

A laser pulse may exhibit chirp, wherein the instantaneous frequency of the laser pulse changes with time. As a laser pulse exhibiting chirp propagates through the optical medium, the width and or shape of the laser pulse may change due to the dispersion of the optical medium, which may be unwanted. For example, a laser pulse exhibiting chirp may broaden when it travels in an optical fiber. The broadening of the laser pulses travelling through the optical medium may limit the maximum transmission distance. For example, if two laser pulses, representing different bits, broaden so much that they mix, the information comprised in the two bits may be corrupted.

There is room for improvement in the way laser pulses are currently created.

SUMMARY

The present disclosure enables creation of laser pulses. The present disclosure also enables creation of laser pulses for improved optical communication. The present disclosure enables creation of laser pulses with little chirp and or stable instantaneous frequency. The present disclosure enables power-efficient and or cost-efficient creation of laser pulses.

These and other features of the present disclosure may be at least partly met by the independent claims. Additional embodiments are set out in the dependent claims.

According to a first aspect, there is provided a laser comprising:
- a loop resonator forming a closed loop light path, the loop resonator comprising an optical gain medium configured to lase, the loop resonator being configured to, during lasing of the optical gain medium, present a pair of modes:
  - a mode of light propagating in a clockwise direction in the closed loop light path of the loop resonator, termed CW mode, and
  - a mode of light propagating in a counter-clockwise direction in the closed loop light path of the loop resonator, termed CCW mode;
- a first light output, configured to output laser light from the laser; and
- an optical power modulating unit, being a unit configured to modulate:
  - an optical power of the CW mode of the loop resonator; and
  - an optical power of the CCW mode of the loop resonator;
- wherein the laser is configured to create a laser pulse at the first light output by generating, by the optical power modulating unit:
- a first power modulation pulse, being a change in optical power of the CW mode of the loop resonator, the change in optical power of the CW mode of the loop resonator having a positive or negative sign; and
  - a second power modulation pulse, being a change in optical power of the CCW mode of the loop resonator, the change in optical power of the CCW mode of the loop resonator having a positive or negative sign,
  - wherein the laser is further configured to, when generating the first and second power modulation pulse:
- set a timing of the first and second power modulation pulse such that the first and second power modulation pulse, at least partially, overlap in time; and
- set the sign of the change in optical power of the first power modulation pulse opposite to the sign of the change in optical power of the second power modulation pulse,
- whereby a change in a total optical power in the loop resonator is mitigated and a chirp of the laser pulse is reduced.

A laser pulse may be created by changing the optical power of a mode, e.g. a lasing mode, of the resonator of the laser. The intensity of the light that is outputted from the laser, which originates from the mode, may then also change and a laser pulse may be created at the output. A laser pulse may e.g. be created by direct modulation of the drive current of a laser diode such that also the population inversion and the optical power of the lasing mode, is modulated.

Direct modulation of the population inversion of the optical gain medium in the resonator may cause a chirp in the laser pulse. For example, in a directly modulated laser diode an increase in the drive current may increase the charge density in the laser diode and thus also the population inversion but this may also change the refractive index of the laser diode. This may lead to a shift in a resonance frequency of the laser diode during the creation of the laser pulse which may cause a chirp in the laser pulse. The chirp may be particularly problematic when the modulation bandwidth is high, i.e. during fast modulation.

A laser according to the first aspect enables creation of laser pulses, in particular enables creation of laser pulses for improved optical communication. A first and second power modulation pulse overlapping, at least partially, in time and having opposite signs nay keep the total optical power in the loop resonator stable. Thus the population inversion in the optical gam medium of the loop resonator, and thereby also the refractive index of the optical gain medium of the loop resonator, may be kept stable and the chirp of the laser pulse may be mitigated or prevented.

The following non-limiting, example illustrates the first aspect. The laser may be configured to deliver laser light to an optical system e.g. to an optical fiber, primarily from one of the modes of the pair of modes e.g. from the CW mode. The laser light may be delivered to the optical system at the first light output. The other mode in this example the CCW mode, may be used for stabilizing the population inversion of the optical gain medium. Continuing the example, the first power modulation pulse may increase the optical power of the CW mode of the loop resonator to create an increase in the intensity of the laser light at the first light output. The change in optical power of the CW mode of the loop resonator may then be considered to have a positive sign. The second power modulation pulse may then decrease the optical power of the CCW mode of the loop resonator. The change in optical power of the CCW mode of the loop resonator may then be considered to have a negative sign. The timing of the first and second power modulation pulse may be set such that the first and second power modulation pulse, at least partially, overlap in time. The timing of the first and second power modulation pulse may be set such that the fast and second power modulation pulse, at least partially, overlap in time at a point in the optical gain medium. Thus, in the above example, the first power modulation pulse may increase the optical power of the CSV mode in the optical gain medium simultaneously, or approximately simultaneously, as the second power modulation pulse decreases the optical power of the CCW mode in the optical gain medium. Consequently, the second power modulation pulse may compensate, at least partially, for a change in population inversion that the first power modulation pulse may cause. Consequently, the second power modulation pulse may compensate, at least partially, for a shift in a resonance frequency of the laser diode that the first power modulation pulse could have caused, had there not been any second power modulation pulse. The chirp of the laser pulse may thereby be small and the instantaneous frequency of the laser pulse may be stable.

In line with the above example, a laser according to the first aspect enables creation of laser pulses with little chirp and/or stable instantaneous frequency.

Further, a laser according to the first aspect is power-efficient. The laser may e.g. have a low power consumption and/or a high wall plug efficiency. As chirp may be mitigated by the use of the first and second power modulation pulse, the population inversion of the optical gain medium may be kept low and thereby the power consumption of the laser may be kept low. It may not be necessary to use e.g. a large drive current to achieve a large population inversion to keep the relative changes in refractive index low, as could be used in a directly modulated laser diode. A laser with a loop resonator can often be operated with a low drive current. Further, it may not be necessary to use external modulation of a continuous wave laser which may be associated with an insertion loss that results in a low wall-plug efficiency.

Further, a laser according to the first aspect is cost-efficient. A laser with a loop resonator can often be produced at a low cost as it is straightforward to fabricate, e.g. by etching a loop waveguide of a size suitable to a predetermined wavelength. Further, a laser according to the first aspect has a small footprint, e.g. compared to other lasers with a small chirp, which may result in a lower manufacturing cost.

Further, a laser according to the first aspect is versatile. It may be used in many different optical systems. For example, the laser may operate in a large wavelength range, e.g. in a larger wavelength range than a laser with an external modulator.

The loop resonator of the laser may comprise a waveguide in the form of a closed loop, e.g. a closed loop around a void. The waveguide may be e.g. a strip waveguide or a ridge waveguide. The waveguide in the form of a closed loop may have the shape of a ring, an ellipse, an oval, or a polygon. Thus, the loop resonator may be e.g. a ring waveguide, an elliptical waveguide, or a hexagonal waveguide. Alternatively, the loop resonator may comprise a disc or a sphere within which whispering gallery modes form. The whispering gallery modes may form the closed loop light path. The disc or sphere may be a microdisc or a microsphere.

The loop resonator may be the resonant optical cavity of the laser. Thus, a laser wavelength may be defined by a length of the closed loop light path. Alternatively, the loop resonator may be part of the resonant optical cavity of the laser. For example, the laser may comprise a first reflector, a first light path leading from the reflector to the closed loop light path, and a second light path leading from the closed loop light path to a second reflector. Thus, light may travel from the first reflector, via the first light path into the closed loop light path, exit the closed loop light path via the second light path and travel to the second reflector where it may be reflected back towards the first reflector. The resonant optical cavity of the laser may then comprise the first and second light path as well as the closed loop light path.

The loop resonator comprises an optical gain medium configured to lase. For example, the optical gain medium may be a semiconductor. The optical gain medium may be configured to lase by comprising means to create population inversion. In the case of the semiconductor optical gain medium, the semiconductor may comprise a p-n junction or a p-i-n junction ("p" referring to p-doped material, "i" referring to intrinsic (non-doped) material, and "n" referring to n-doped material). The semiconductor may further comprise means to inject a drive current into the p-n or p-i-n junction to form the population inversion. The semiconductor may further comprise one or more quantum wells in connection to the p-n or p-i-n junction, e.g. to form a high density of states. In the case of the loop resonator comprising a waveguide in the form of a closed loop, the waveguide forming the closed loop may be made of semiconductor material.

The pair of modes comprise a CW mode and a CCW mode. The CW mode and the CCW mode may be modes of the same wavelength. Alternatively, the CW mode and the CCW mode may be modes of different wavelengths. The laser may be configured to primarily output laser light from one of the modes, e.g. the CCW mode, of the pair of modes at the first light output. Thus, the laser light at the first light output may originate only from one of the modes, e.g. the CCW mode, of the pair of modes, or mainly from one of the modes of the pair of modes, e.g. 70% of the light originating from the CCW mode and 30% of the light originating from the CW mode. The laser may be configured to output laser light at a second light output. The light outputted by the second light output may primarily originate from the mode which is not primarily outputted at the first light output.

The pair of modes may not necessarily be the only modes presented by the loop resonator. For example, the loop resonator may present several pairs of modes. The first power modulation pulse may not necessarily only change the optical power of one CW mode of the loop resonator, the first power modulation pulse may e.g. change the optical power of several CW modes of the loop resonator simultaneously. Analogously, the second power modulation pulse may not necessarily only change the optical power of one CCW mode of the loop resonator, the second power modulation pulse may e.g. change the optical power of several CCW modes of the loop resonator simultaneously.

The laser may be configured to set a ratio between a magnitude of the change in optical power of the first power modulation pulse and a magnitude of the change in optical power of the second power modulation pulse to a value of 1. Thus, the change in optical power of the CW mode of the loop resonator may have the same magnitude, but opposite sign, as the change in optical power of the CCW mode of the loop resonator. In other words, the increase in optical power of one of the modes of the pair of modes may be of the same magnitude as the decrease in optical power of the other mode of the pair of modes.

However, in some embodiments, the ratio may not be exactly 1. For example, the laser may be configured to set a ratio between a magnitude of the change in optical power of the first power modulation pulse and a magnitude of the change in optical power of the second power modulation pulse to a value between 0.25 and 4. Thus, the change in optical power of one mode of the pair of modes may be as small as a quarter of the change in optical power of other mode of the pair of modes. This may still be sufficient to reduce a chirp in the outputted laser pulse, even if it may not necessarily eliminate the chirp completely.

The laser may be configured to keep the total optical power in the loop resonator constant during a time period comprising the first and second power modulation pulses. However, in some embodiments, the total optical power in the loop resonator may not be exactly constant. For example, the laser may be configured to prevent the total optical power in the loop resonator from changing by more than 50% during a time period comprising the first and second power modulation pulses. Depending on the application, other limits may also be perceived. For example, the laser may be configured to prevent the total optical power in the loop resonator from changing by more than 30%, or more than 10%, or more than 5%, during a time period comprising the first and second power modulation pulses. The more stable the total optical power in the loop resonator is kept, the smaller the chin may be in the outputted laser pulse. The total optical power in the loop resonator may be the sum of the optical power of the pair of modes. The total optical power in the loop resonator may be the sum of the optical power of all the modes in the loop resonator.

The laser may be configured to keep the population inversion of the optical gain medium of the loop resonator constant during a time period comprising the first and second power modulation pulses. However, in some embodiments, the population inversion of the optical gain medium of the loop resonator may not be exactly constant. For example, the laser may be configured to prevent a population inversion of the optical gain medium of the loop resonator from changing by more than 50% during a time period comprising the first and second power modulation pulses. Depending on the application, other limits may also be perceived. For example, the laser may be configured to prevent a population inversion of the optical gain medium of the loop resonator from changing by more than 30%, or more than 10% or more than 5%, during a time period comprising the first and second power modulation pulses. The more stable the population inversion of the optical gain medium of the loop resonator is kept, the smaller the chirp may be in the outputted laser pulse.

The laser may be configured to generate the first and second power modulation pulses by modulating a coupling coefficient of the laser, the coupling coefficient representing a transfer rate of power from one mode of the pair of modes to the other mode of the pair of modes. Modulating a coupling coefficient may be a straightforward and or cost-efficient way to facilitate that the sign of the change in optical power of the first power modulation pulse is set opposite to the sign of the change in optical power of the second power modulation pulse. When the coupling coefficient represents a transfer rate of power from one mode of the pair of modes to the other mode of the pair of modes, an increase in optical power of one mode of the pair of modes may be automatically accompanied by a decrease in optical power of the other mode of the pair of modes as optical power may be transferred from one mode to the other.

The optical power modulating unit of the laser may comprise a single part or two or more parts. When the optical power modulating unit comprises two parts, a first part of the optical power modulating unit may be configured to generate the first power modulation pulse and a second part of the optical power modulating unit may be configured to generate the second power modulation pulse. Having one part generating the first power modulation pulse and another part generating the second power modulation pulse may be a straightforward and cost-efficient way to implement the optical power modulating unit. However, it should be understood that a part of the optical power modulating unit that generates e.g. a first power modulation pulse to change the optical power of the CW mode of the loop resonator may also affect the optical power of the CCW mode of the loop resonator. For example, when optical power is transferred from one mode of the pair of modes to the other mode of the pair of modes this may be seen as a consequence of both a first and a second power modulation pulse.

The optical power modulating unit of the laser may comprise a bypass waveguide optical modulator part comprising:
   a loop resonator bypass waveguide, the loop resonator bypass waveguide being a waveguide configured to receive a light field from one mode of the pair of modes of the loop resonator at a first point of the loop resonator, guide the light field, and deliver at least part of the light field into the other mode of the pair of modes of the loop resonator at a second point of the loop resonator, the delivered light field thereby bypassing a part of the loop resonator between the first and second point of the loop resonator; and
   an intensity modulator configured to modulate an intensity of the light field guided by the loop resonator bypass waveguide, such that an intensity of the light field delivered by the loop resonator bypass waveguide at the second point of the loop resonator is modulated to form at least part of the first or second power modulation pulse.

A bypass waveguide optical modulator part may be a straightforward and cost-efficient way to generate a power modulation pulse. As part of a light field received from one mode of the pair of modes may be delivered to the other mode of the pair of modes the modulation of the optical power of the modes may be power-efficient. Optical power removed from one mode of the pair of modes may be reintroduced in the other mode of the pair of modes, and thereby recycled.

The optical power modulating unit of the laser may comprise a first and a second bypass waveguide optical modulator part, wherein
   the received light field of the loop resonator bypass waveguide of the first bypass waveguide optical modulator part is a CW mode light field; and
   the received light field of the loop resonator bypass waveguide of the second bypass waveguide optical modulator part is a CCW mode light field.

Thus, the optical power of either of the modes may be either increased or decreased.

The laser may comprise a bus waveguide with a first end and a second end, the bus waveguide being optically coupled to the loop resonator at a point between the first and second end, the bus waveguide being configured to guide laser light from the loop resonator.

The bus waveguide may be used to efficiently couple light out of the loop resonator. For example, a bus waveguide may be used to transport light front the loop resonator to the first or second light output. Alternatively, or additionally, the bus waveguide, or part of the bus waveguide, may be comprised in the optical power modulating unit.

The bus waveguide may be e.g. a strip waveguide or a ridge waveguide, or an optical fiber. The bus waveguide may be optically coupled to the loop resonator by evanescent wave coupling.

The laser may comprise a reflector at the first end of the bus waveguide and a reflector at the second end of the bus waveguide each of the reflectors at the first and second end of the bus waveguide being configured to reflect part of a light field front the bus waveguide back into the bus waveguide.

Thus, light may circulate between the reflector at the first end of the bus waveguide and the reflector at the second end of the bus waveguide. As the bus waveguide is optically coupled to the loop resonator at least part of the circulating light may pass the loop resonator. The reflectors of the bus waveguide may, together with the loop resonator, serve to define the resonant optical cavity of the laser. Thus, the wavelength of the laser may be, at least partially defined, by the distance between the reflectors of the bus waveguide.

Further, the reflectors of the bus waveguide may be used to generate the power modulation pulses. The optical power modulating unit may be configured to generate the first and second power modulation pulse by increasing a reflectivity of the reflector at one end of the bus waveguide and decreasing a reflectivity of the reflector at the other end of the bus waveguide. Thus, a reflector of the bus waveguide may be comprised in a part of the optical power modulating unit that generates a power modulation pulse. The increase in reflectivity of the reflector at one end of the bus waveguide and the decrease in reflectivity of the reflector at the other end of the bus waveguide may be simultaneous. Thus, the optical power modulating unit may be configured to generate the first and second power modulation pulse by, simultaneously, increasing a reflectivity of the reflector at one end of the bus waveguide and decreasing a reflectivity of the reflector at the other end of the bus waveguide. In the following, three examples will be given of how a reflector of the bus waveguide may be implemented such that it can generate at least part of a power modulation pulse.

According to the first example, the optical power modulating unit may comprise a Bragg reflector optical modulator part comprising:
- a Bragg reflector at the first or second end of the bus waveguide, configured to reflect part of a light field from the bus waveguide back into the bus waveguide; and
- an intensity modulator configured to modulate an intensity of the reflected part of the light field,
  such that a reflectivity of the Bragg reflector is modulated to form part of the first or second power modulation pulse.

The Bragg reflector may alternatively be called a Bragg mirror or a distributed Bragg reflector. The Bragg reflector may be a periodic variation in the effective refractive index of the bus waveguide. The periodic variation in the effective refractive index of the bus waveguide may be caused e.g. by a periodic change in the thickness of the bus waveguide, an periodic change in the composition of the bus waveguide, a periodic strain field in the bus waveguide, a grating in the vicinity of the bus waveguide, e.g. close enough to affect the evanescent field of the bus waveguide.

According to the second example, the optical power modulating unit may comprise a loop reflector optical modulator part comprising:
- a loop reflector at the first or second end of the bus waveguide, the loop reflector comprising: a waveguide splitter, a first and a second waveguide, and a coupling loop resonator,
- the waveguide splitter being configured to split light from the bus waveguide into the first and second waveguides;
- the coupling loop resonator forming a closed loop light path, the coupling loop resonator being configured to optically couple to both the first and second waveguide such that:
  a part of a light field leaving the bus waveguide via the first waveguide is coupled back into the into bus waveguide via the coupling loop resonator and the second waveguide, and a part of the light field leaving the bus waveguide via the second waveguide is coupled back into the into bus waveguide via the coupling loop resonator and the first waveguide;
- the loop reflector thereby being configured to reflect part of the light field from the bus waveguide back into the bus waveguide;

the loop reflector optical modulator part further comprising:
- an intensity modulator configured to modulate an intensity of the reflected part of the light field, such that a reflectivity of the loop reflector is modulated to form part of the first or second power modulation pulse.

According to the third example, the optical power modulating unit may comprise a bypass waveguide reflector optical modulator part comprising:
- a bus bypass waveguide reflector at the first or second end of the bus waveguide, the bus bypass waveguide reflector being a waveguide configured to receive a light field travelling in a first direction of the bus waveguide at a first point of the bus waveguide, guide the light field, and deliver at least part of the light field back into the bus waveguide, travelling in a second direction of the bus waveguide, at a second point of the bus waveguide, the delivered light field thereby bypassing a part of the bus waveguide between the first and second point of the bus waveguide, the bus bypass waveguide reflector thereby being configured to reflect part of a light field from the bus waveguide back into the bus waveguide; and
- an intensity modulator configured to modulate an intensity of the reflected part of the light field,
  such that a reflectivity of the bus bypass waveguide reflector is modulated to form part of the first or second power modulation pulse.

In the case where the optical power modulating unit comprises two parts, the first part of the optical power modulating unit may be either a Bragg reflector optical modulator part, a loop reflector optical modulator part, or a bypass waveguide reflector optical modulator part; and the second part of the optical power modulating unit may be either a Bragg reflector optical modulator part, a loop reflector optical modulator part, or a bypass waveguide reflector optical modulator part. In some embodiments both the first and the second part of the optical power modulating unit may be of the same type.

The optical power modulating unit may comprise a first optical modulator configured to modulate the optical power of the CW mode of the loop resonator and a second optical modulator configured to modulate the optical power of the CCW mode of the loop resonator.

Having one optical modulator configured to modulate the optical power of the CW mode of the loop resonator and a second optical modulator configured to modulate the optical power of the CCW mode of the loop resonator may ensure that the optical power of the two modes of the pair of modes may be accurately and/or independently controlled. The first optical modulator may e.g. be an intensity modulator of either a bypass waveguide optical modulator part, a Bragg reflector optical modulator part, a loop reflector optical modulator part, or a bypass waveguide reflector optical modulator part. The second optical modulator may e.g. be an intensity modulator of either a bypass waveguide optical modulator part, a Bragg reflector optical modulator part, a loop reflector optical modulator part, or a bypass waveguide reflector optical modulator part.

An intensity modulator may be implemented in various ways. For example, when the optical power modulating unit comprises either a bypass waveguide optical modulator part, a Bragg reflector optical modulator part, a loop reflector optical modulator part, or a bypass waveguide reflector optical modulator part, then at least one of the intensity modulators of the optical power modulating unit may be an electro-absorption modulator or a semiconductor optical amplifier. For example, when the optical power modulating unit comprises either a Bragg reflector optical modulator part or a loop reflector optical modulator part, then at least one of the intensity modulators of the optical power modulating unit may be an electro optic modulator.

According to a second aspect, there is provided a method for creating a laser pulse from a laser, wherein the laser comprises:
a loop resonator forming a closed loop light path, the loop resonator comprising an optical gain medium configured to lase, the loop resonator being configured to, during lasing of the optical gain medium, present a pair of modes:
a mode of light propagating in a clockwise direction in the closed loop light path of the loop resonator, termed CW mode, and
a mode of light propagating in a counter-clockwise direction in the closed loop light path of the loop resonator, termed CCW mode;
a first light output, configured to output laser light from the laser; and
an optical power modulating unit, being a unit configured to modulate:
an optical power of the CW mode of the loop resonator; and
an optical power of the CCW mode of the loop resonator,
wherein the method comprises:
generating, by the optical power modulating unit:
a first power modulation pulse, bring a change in optical power of the CW mode of the loop resonator, the change in optical power of the CW mode of the loop resonator having a positive or negative sign; and
a second power modulation pulse, being a change in optical power of the CCW mode of the loop resonator, the change in optical power of the CCW mode of the loop resonator having a positive or negative sign;
wherein the method further comprises, when generating the first and second power modulation pulse:
setting a timing of the first and second power modulation pulse such that the first and second power modulation pulse, at least partially, overlap in time; and
setting the sign of the change in optical power of the first power modulation pulse opposite to the sign of the change in optical power of the second power modulation pulse,
whereby the laser pulse is created by the laser at the first light output while a change in a total optical power in the loop resonator is mitigated and a chirp of the laser pulse is reduced.

The method according to the second aspect may possibly be the subject of a future divisional application.

BRIEF DESCRIPTION OF THE DRAWINGS

The above, as well as additional features of the present disclosure, will be better understood through the following illustrative and non-limiting detailed description, with reference to the appended drawings. In the drawings like reference numerals will be used for like elements unless stated otherwise.

DETAILED DESCRIPTION

In cooperation with attached drawings, the technical contents and detailed description are described thereinafter according to example embodiments, being not used to limit the claimed scope. Various different embodiment are possible and should not be limited to the embodiments set forth herein; rather, the embodiments herein are provided for thoroughness and completeness, and fully convey the scope of the disclosure to the skilled person.

Figure 1:
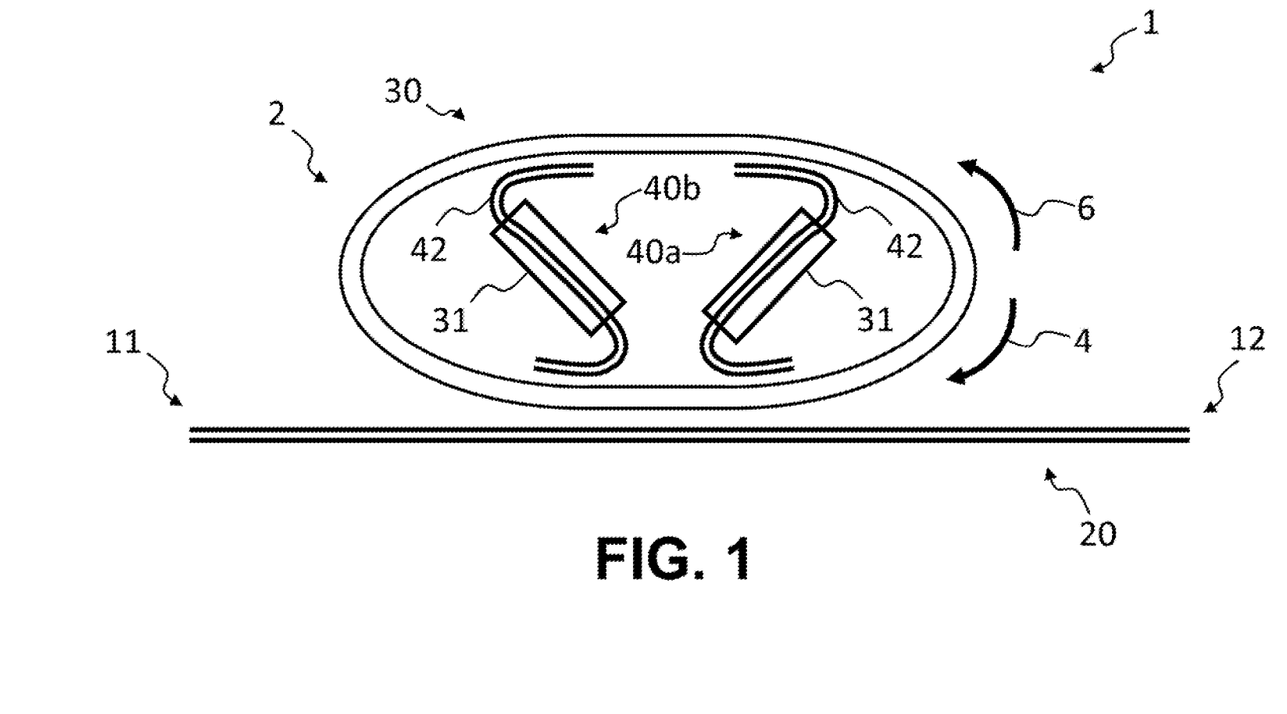
FIG. 1 illustrates a laser comprising bypass waveguide optical modulator part, according to example embodiments.
Figure 2:
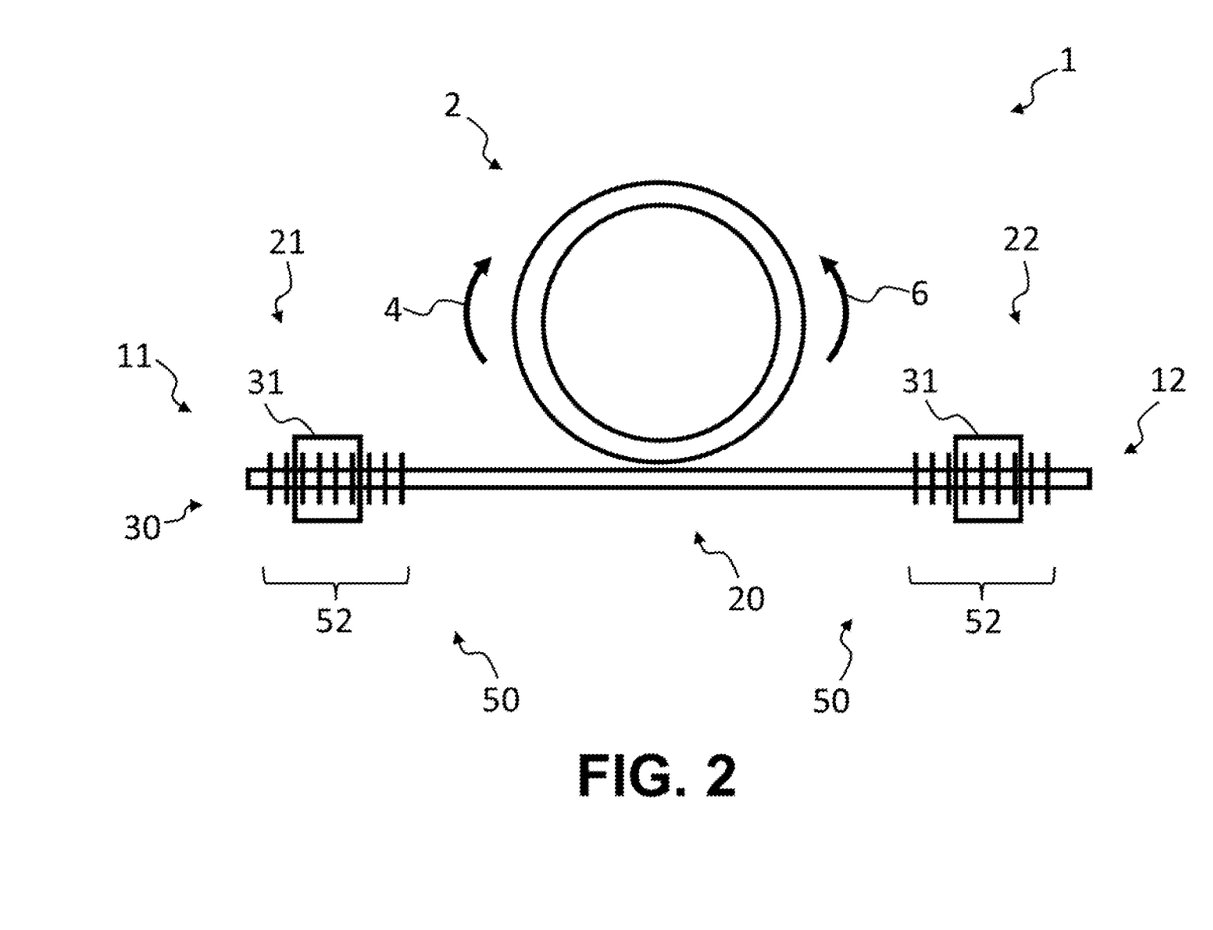
FIG. 2 illustrates a laser comprising a Bragg reflector optical modulator part, according to example embodiments.
Figure 3:
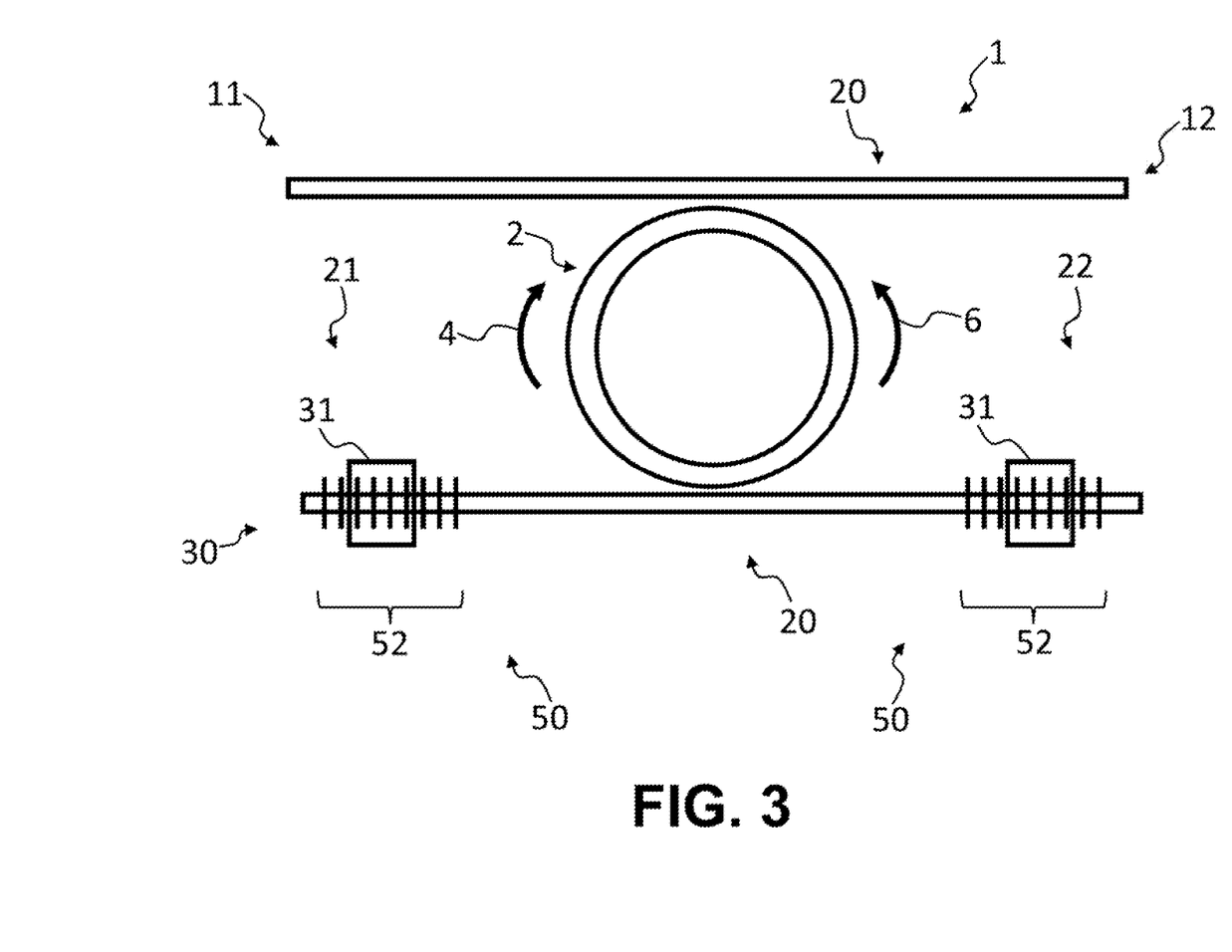
FIG. 3 illustrates a laser comprising a Bragg reflector optical modulator part, according to example embodiments.
Figure 4:
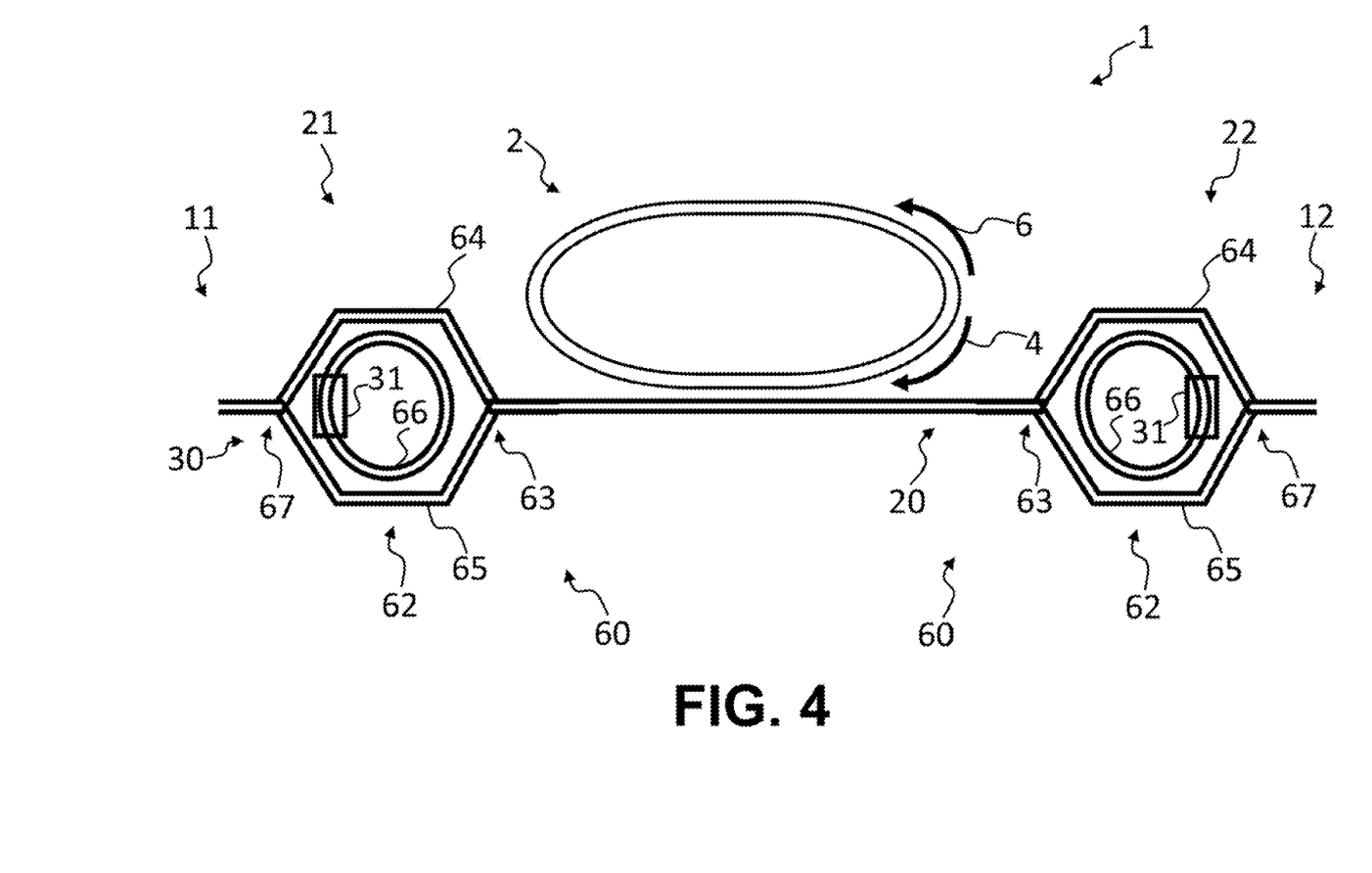
FIG. 4 illustrates a laser comprising a loop reflector optical modulator part, according to example embodiments.
Figure 5:
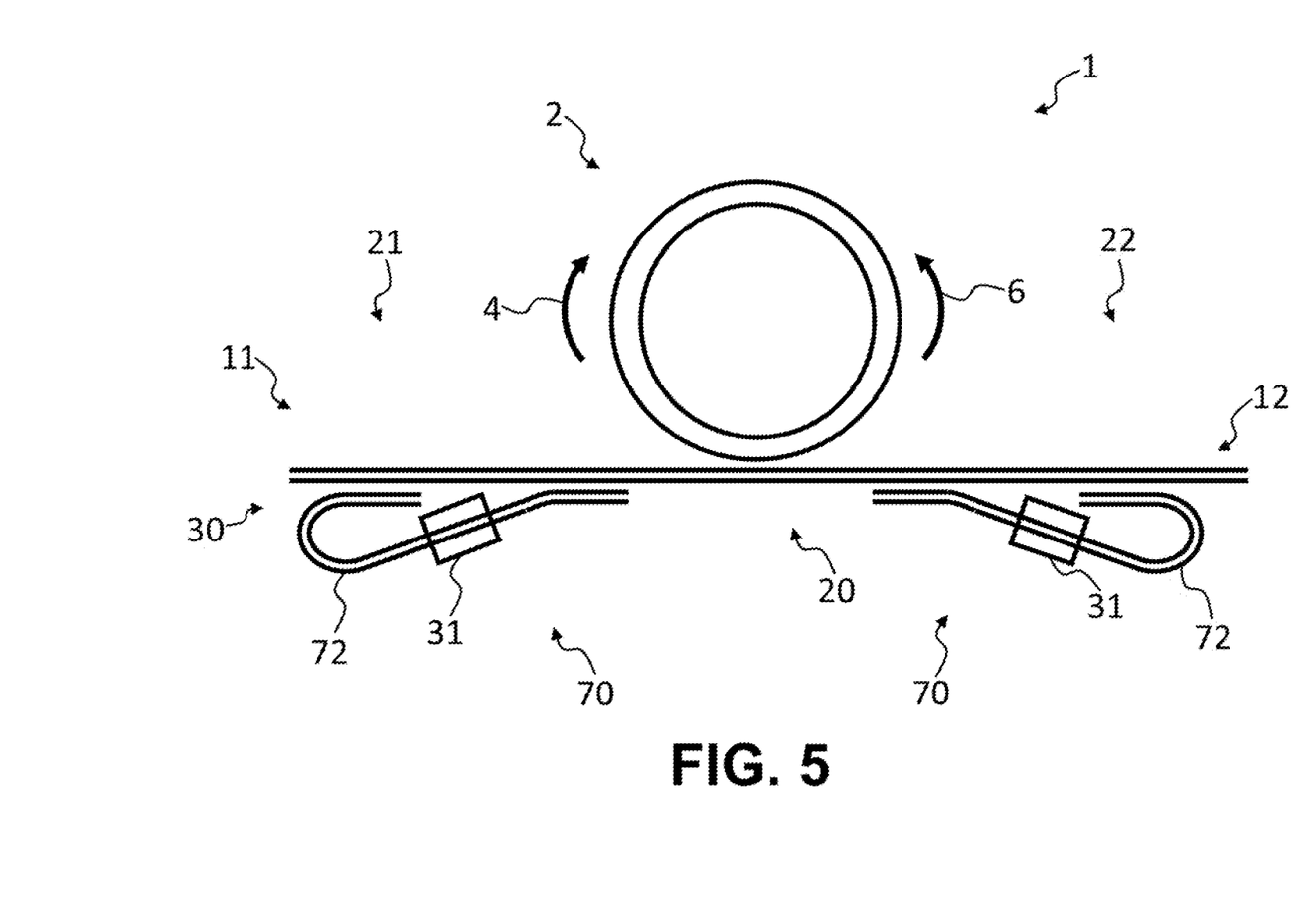
FIG. 5 illustrates a laser comprising a bypass waveguide reflector optical modulator part, according to example embodiments.

FIGS. 1-5 illustrate different embodiments of the laser 1. It should be understood that the embodiments described in the figures and below do not represent an exhaustive set of embodiments of the laser 1. For example, features of one of the embodiments of FIGS. 1-5 may be combined with features of another of the embodiments of FIGS. 1-5, unless otherwise stated. The lasers 1 in the embodiments of FIGS. 1-5 all comprise a loop resonator 2. In FIGS. 1-5, the loop resonator 2 is a waveguide in the form of a closed loop. The waveguide may be e.g. a strip waveguide or a ridge waveguide. The shape of the closed loop may be an oval shape, as illustrated in FIG. 1 and FIG. 4, or a ring shape, as illustrated in FIGS. 2, 3, and 5. Other shapes may alternatively be used, e.g. an elliptical shape or a polygon shape. As an alternative to a strip waveguide or a ridge waveguide forming the loop resonator 2, a slab waveguide may be used, the slab waveguide may e.g. form a disc, e.g. a microdisc, which presents closed loop light paths in the form of whispering gallery modes. As a further alternative, a sphere, e.g. a microsphere, may be used to form the loop resonator 2.

The loop resonator 2 is configured to present a CW mode of light propagating in a CW direction 4 and a CCW mode of light propagating in a CCW direction 6. The CW direction 4 and the CCW direction 6 are illustrated in FIGS. 1-5. The CCW direction 6 may be a direction opposite to rite CW direction 4.

The lasers 1 in the embodiments of FIGS. 1-5 all comprise an optical power modulating unit 30 configured to modulate an optical power of the CW mode of the loop resonator 2 and an optical power of the CCW mode of the loop resonator 2.

The lasers 1 in the embodiments of FIGS. 1-5 comprise a bus waveguide 20, e.g. in the form of a strip waveguide or a ridge waveguide. For example, in all of the embodiments of FIGS. 1-5, a bus waveguide 20 is configured to couple light from the loop resonator 2 to the first light output 11. However, it should be understood that there may be other ways to couple light from the loop resonator 2 to the first light output 11. As an example, the first light output 11 may be a facet of the loop resonator 2, e.g. a facet of a polygon shaped loop resonator 2. If light within the loop resonator 2 strikes the facet at an angle below the critical angle for total internal reflection, part of the light may escape the loop resonator 2 at the facet, the facet may then be used as a first light output 11. As another example, the first light output 11 may be a perturbation in the loop resonator 2, e.g. a perturbation that scatters light out of the loop resonator 2, e.g. an indentation or protuberance in the loop resonator. In FIGS. 2-5, a bus waveguide 20 is comprised in the optical power modulating unit 30, but in FIG. 1 the bus waveguide 20 is not comprised in the optical power modulating unit 30. An arrangement with one bus waveguide 20 coupling light from the loop resonator 2 to the first light output 11 and another bus waveguide 20 comprised in the optical power modulating unit 30, as illustrated in FIG. 3, may be used because the laser pulse may be more easily controlled when the first light output 11 is not directly connected to the optical power modulating unit 30. Such an arrangement may of course not only be implemented in the embodiment of FIG. 3. For example, the embodiments of FIG. 4 and FIG. 5 may easily be modified to include such an arrangement.

The loop resonator 2 of the laser comprises an optical gain medium configured to lase. The optical gain medium may be a semiconductor. In the embodiments of FIGS. 1-5, the waveguide forming the loop resonator 2 may be made of semiconductor material.

Figure 7:
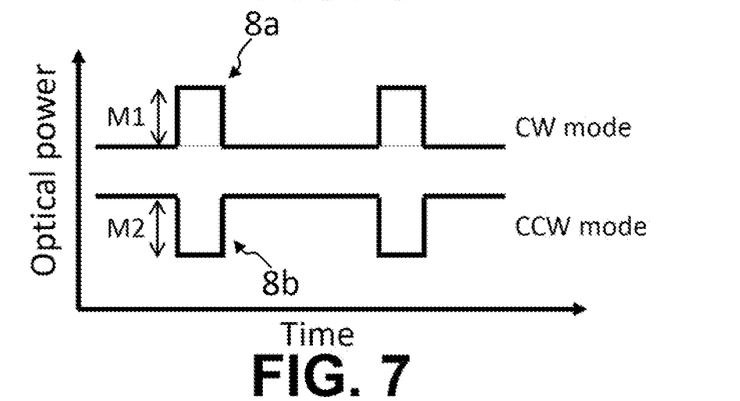
FIG. 7 illustrates power modulation pulses, according to example embodiments.

The laser is configured to create a laser pulse at the first light output by generating, by the optical power modulating unit, a first power modulation pulse 8a and a second power modulation pulse 8b. The first power modulation pulse 8a is a change in optical power of the CW mode of the loop resonator 2 while the second power modulation pulse 8b, is a change in optical power of the CCW mode of the loop resonator 2. FIG. 7 illustrates a first 8a and second 8b power modulation pulse which may be generated by any of the lasers in FIGS. 1-5. Each power modulation pulse 8a, 8b may have a start time and an end time. The change in optical power of the first power modulation pulse 8a may have a magnitude, M1. The change in optical power of the second power modulation pulse 8b may have a magnitude, M2. FIG. 7 illustrates that the first power modulation pulse 8a changes the optical power of the CW mode by −M1 while the second power modulation pulse 8b changes the optical power of the CCW mode by −M2. Thus, in FIG. 7 the sign of the change in optical power of the first power modulation pulse 8a is opposite to the sign of the change in optical power of the second power modulation pulse 8b. Further, in FIG. 7 the magnitude of the change in optical power of the first power modulation pulse 8a is equal to the magnitude of the change in optical power of the second power modulation pulse 8b, in this case M1−M2. Thus, a ratio between a magnitude of the change in optical power of the first power modulation pulse 8a and a magnitude of the change in optical power of the second power modulation pulse 8b is 1 in this case. Further, in FIG. 7 the first 8a and second 8b power modulation pulses save the same start time. Further, in FIG. 7 the first 8a and second 8b power modulation pulses lave the same end time. Thus, the first 8a and second 8b power modulation pulses may be simultaneous. The first 8a and second 8b power modulation pulses may be simultaneous at at least one point in the optical gain medium. The first 8a and second 8b power modulation pulses may be simultaneous at a central point of the optical gain medium. In FIG. 7, the total optical power in the loop resonator 2, in this case the combined optical power of the CW mode and the CCW mode, is kept constant.

Figure 8:
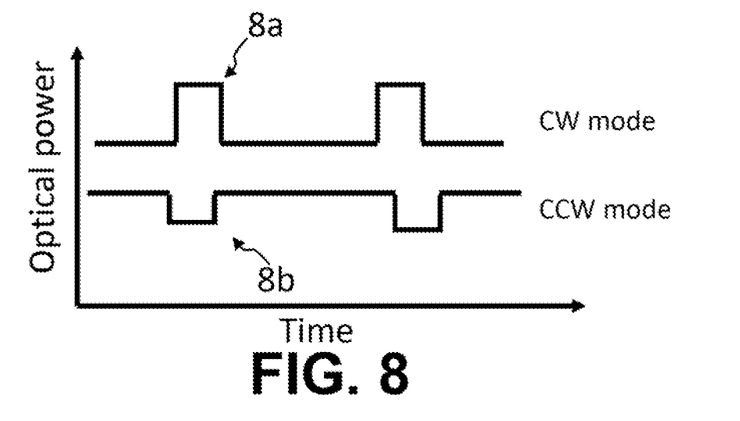
FIG. 8 illustrates power modulation pulses, according to example embodiments.

It should be understood that, in some embodiments, the first 8a and second 8b power modulation pulses may not be exactly simultaneous or even have the same magnitude. FIG. 8 illustrates such a situation. FIG. 8 illustrates a situation where a timing of the first 8a and second 8b power modulation pulse is set such that the first 8a and second 8b power modulation pulse overlap partially in time. FIG. 8 illustrates a situation where the sign of the change in optical power of the first power modulation pulse 8a is set opposite to the sign of the change in optical power of the second power modulation pulse 8b, but where the magnitude of the first 8a and second 8b power modulation pubes are different.

At a time prior to the first 8a and second 8b power modulation pulses and at a time after the first 8a and second 8b power modulation pulses, the optical power of the CW mode may be a CW mode baseline optical power while the optical power of the CCW mode may be a CCW mode baseline optical power. The CW mode baseline optical power and the CCW mode baseline optical power may be the same. Alternatively, the CW mode baseline optical power and the CCW mode baseline optical power may be different, as illustrated in FIG. 7 and FIG. 8.

The laser 1 may be configured to keep the total optical power in the loop resonator 2 constant, or within a range e.g. ±5%, ±10%, ±30%, ±50%, during a time period comprising the first 8a and second 8b power modulation pulses. This may be achieved e.g. by the first 8a and second 8b power modulation pulses in FIG. 7.

The laser may be configured to keep the population inversion of the optical gain medium of the loop resonator 2 constant or within a range (e.g., ±5%, ±10%, ±30%, ±50%) during a time period comprising the first and second power modulation pulses.

The first 8a and second 8b power modulation pulses may be generated in many different ways. The laser 1 may be configured to generate the first 8a and second 8b power modulation pulses by modulating a coupling coefficient of the laser 1, the coupling coefficient representing a transfer rate of power from one mode of the pair of modes to the other mode of the pair of modes. Any one of the lasers 1 in FIGS. 1-5 may be seen as lasers 1 configured to modulate the coupling coefficient.

FIG. 1 illustrates a laser 1 wherein the optical power modulating unit 30 comprises a first 40*a* and second 40*b* bypass waveguide optical modulator part. Each bypass waveguide optical modulator part 40*a*, 40*b* comprises a loop resonator bypass waveguide 42, being a waveguide configured to receive a light field from one mode of the pair of modes of the loop resonator 2 at a first point of the loop resonator 2, guide the light field, and deliver at least part of the light field into the other mode of the pair of modes of the loop resonator 2 at a second point of the loop resonator 2.

The loop resonator bypass waveguide 42 may e.g. be a waveguide with two ends, one end adjacent to the first point of the loop resonator 2 and another end adjacent to the second point of the loop resonator 2. The two ends of the loop resonator bypass waveguide 42 may point in the same loop direction.

In FIG. 1, the loop resonator bypass waveguide 42 of the first bypass waveguide optical modulator part 40*a* is configured to receive a light field from the CW mode. Both ends of the loop resonator bypass waveguide 42 of the first bypass waveguide optical modulator part 40*a* points in the CCW direction of the loop resonator 2. Thus, the loop resonator bypass waveguide 42 of the first bypass waveguide optical modulator part 40*a* may receive a light field from the CW mode at either end of the loop resonator bypass waveguide 42 and deliver at least part of the light field into the CCW mode at the other end of the loop resonator bypass waveguide 42.

In FIG. 1, the loop resonator bypass waveguide 42 of the second bypass waveguide optical modulator part 40*b* is configured to receive a light field from the CCW mode. Both ends of the loop resonator bypass waveguide 42 of the second bypass waveguide optical modulator part 40*b* points in the CW direction of the loop resonator 2.

In FIG. 1, bypass waveguide optical modulator part 40*a*, 40*b* comprises an intensity modulator 31 configured to modulate at intensity of the light field guided by the loop resonator bypass waveguide 42.

The intensity modulator 31 may comprise an electro-absorption (EA) modulator. The EA modulator may absorb part the light field guided by the loop resonator bypass waveguide 42. Thus, when light is received at one end of the loop resonator bypass waveguide 42, less light may be delivered at the other end of the loop resonator bypass waveguide 42. The absorption may be controlled by an applied electric field. The EA modulator may be a semiconductor wherein the absorption edge shifts with applied electric field. The semiconductor material of the EA modulator may be the same as the semiconductor material of the optical gain medium of the loop resonator 2.

The intensity modulator 31 may comprise an optical amplifier. The optical amplifier may amplify the light field guided by the loop resonator bypass waveguide 42. Thus, when light is received at one end of the loop resonator bypass waveguide 42, more light may be delivered at the other end of the loop resonator bypass waveguide 42. The optical amplifier may be a semiconductor optical amplifier (SOA). The SOA may be a semiconductor configured to be electrically pumped to achieve population inversion. Thus, the level of amplification may be controlled by a drive current of the SOA. The semiconductor material of the SOA may be the same as the semiconductor material of the optical gain medium of the loop resonator 2.

As an alternative, or in addition, to using bypass waveguide optical modulator parts 40*a*, 40*b* the laser 1 may comprise a bus waveguide 20 optically coupled to the loop resonator 2. The bus waveguide 20 may have a first end 21 and a second end 22, wherein a reflector is situated at each end, 21, 22. Each of the reflectors at the first 21 and second 22 end of the bits waveguide 20 may be configured to reflect part of a light field from the bus waveguide back into the bus waveguide. The reflectors of the bus waveguide 20 may be used to generate the power modulation pulses 8*a*, 8*b*. The optical power modulating unit 30 may be configured to generate the first 8*a* and second 8*b* power modulation pulse by increasing a reflectivity of the reflector at one end of the bus waveguide and decreasing a reflectivity of the reflector at the other end of the bus waveguide. FIGS. 2-5 illustrate embodiments wherein the optical power modulating unit 30 may generate the first 8*a* and second 8*b* power modulation pulse by increasing a reflectivity of the reflector at one end of the bus waveguide 20 and decreasing a reflectivity of the reflector at the other end of the bus waveguide 20.

FIG. 2 illustrates a laser 1 wherein the optical power modulating unit 30 comprises two Bragg reflector optical modulator parts 50. In FIG. 2, one Bragg reflector optical modulator part 50 comprises a Bragg reflector 52 at the first end 21 of the bus waveguide 20. The other Bragg reflector optical modulator part 50 comprises a Bragg reflector 52 at the second end 22 of the bus waveguide 20. The Bragg reflector 52 may be a periodic variation in the effective refractive index of the bus waveguide 20. The periodic variation in the effective refractive index of the bus waveguide 20 may be caused e.g. by an periodic change in the thickness of the bus waveguide 20, a periodic strain field in the bus waveguide 20, a grating in the vicinity of the bus waveguide 20, e.g. close enough to affect the evanescent field of the bus waveguide 20. Further, each Bragg reflector optical modulator part 50 comprises an intensity modulator 31 configured to modulate an intensity of a reflected light field from the Bragg reflector 52.

The intensity modulator 31 may e.g. comprise an EA modulator, as previously described. For example, the Bragg reflector optical modulator part 50 may comprise a semiconductor waveguide, connected to the bus waveguide 20 or being a part of the bus waveguide 20. The semiconductor waveguide may e.g. be connected to a dielectric bus waveguide 20. Grooves may be etched into a section of the semiconductor waveguide with a periodic spacing. The grooves may periodically change the effective refractive index of the semiconductor waveguide to form a Bragg reflector 52. The semiconductor waveguide may be configured such that an electric field may be applied, e.g. between the top and bottom of the semiconductor waveguide. The electric field may be modulated to shift the absorption edge of the semiconductor. Thus, the semiconductor waveguide may function as an EA modulator. Increasing the absorption, at a certain wavelength, e.g. the laser wavelength, may decrease the reflectivity at the wavelength. Decreasing the absorption, at a certain wavelength, e.g. the laser wavelength, may increase the reflectivity at the wavelength. Thus, an intensity of a reflected light field from the Bragg reflector 52 may be modulated. When the reflectivity of the Bragg reflector optical modulator part 50 at the first end 21 of the bus waveguide 20 is increased, the optical power of the CCW mode may increase. Analogously, when the reflectivity of the Bragg reflector optical modulator part 50 at the second end 22 of the bus waveguide 20 is increased, the optical power of the CW mode may increase.

Alternatively, the intensity modulator 31 may comprise an optical amplifier, e.g. a SOA, as previously described. In the above example, the semiconductor EA may be replaced with a SOA.

Alternatively, an intensity of a reflected light field from the Bragg reflector 52 may be modulated by shifting the reflection spectrum of the Bragg reflector 52. The intensity modulator 31 may herein comprise an electro-optic (EO) modulator, e.g. an EO modulator that changes the refractive index of a part of the Bragg reflector 52. Thus, the reflection spectrum may be shifted. The reflectivity for a light field at a certain wavelength, e.g. the laser wavelength, may thus have one value before the shift of the reflection spectrum and another value after the shift of the reflection spectrum.

FIG. 3 illustrates a laser 1 similar to the laser 1 of FIG. 2. In FIG. 2, the first light output 11 is arranged in connection to the bus waveguide 20 comprised in the optical power modulating unit 30. In FIG. 3, the first light output 11 is arranged in connection to a bus waveguide 20 not comprised in the optical power modulating unit 30.

FIG. 4 illustrates a laser 1 wherein the optical power modulating unit 30 comprises two loop reflector optical modulator parts 60. In FIG. 4, one loop reflector optical modulator part 60 comprises a loop reflector 62 it the first end 21 of the bus waveguide 20. The other loop reflector optical modulator part 60 comprises a loop reflector 62 at the second end 22 of the bus waveguide 20.

Each loop reflector 62 in FIG. 4 comprises a waveguide splitter 63, a first 64 and a second 65 waveguide, and a coupling loop resonator 66.

The waveguide splitter 63 is configured to split light from the bus waveguide 20 into the first 64 and a second 65 waveguide. For example, if the bus waveguide 20 and the first 64 and a second 65 waveguide all are strip or ridge waveguides, the bus waveguide 20 may taper into the first 64 and a second 65 waveguide to form the waveguide splitter 63.

The coupling loop resonator 66 forms a closed loop light path and is configured to optically couple to both the first 64 and second 65 waveguide. For example, one point of the coupling loop resonator 66 may be optically coupled to the first waveguide 64 while another point of the coupling loop resonator 66 may be optically coupled to the second waveguide 65. The coupling loop resonator 66 may be optically coupled 10 the first 64 and second 65 waveguide by evanescent wave coupling.

According to the above and to FIG. 4, a part of a light field leaving the bus waveguide 20 via the first waveguide 64 may be coupled back into the into bus waveguide 20 via the coupling loop resonator 66 and the second waveguide 65, and a part of the light field leaving the bus waveguide 20 via the second waveguide 65 may be coupled back into the into bus waveguide 20 via the coupling loop resonator 66 and the first waveguide 64. The loop reflector 62 may thereby be configured to reflect part of the light field from the bus waveguide 20 back into the bus waveguide 20.

The first 64 and second 65 waveguides may be e.g. strip waveguides or ridge waveguides. The first 64 and second 65 waveguides may be joined by a waveguide combiner 67, as illustrated in FIG. 4. Thus, the waveguide splitter 63, the first waveguide 64, the waveguide combiner 67 and the second waveguide 67 may together encircle an area in which the coupling loop resonator 66 is arranged, as illustrated in FIG. 4. The waveguide combiner 67, or a waveguide connected to the waveguide combiner 67 may form the first 11 or second 12 light output.

The coupling loop resonator 66 of the loop reflector 62 may be a waveguide in the form of a closed loop. The waveguide may be e.g. a strip waveguide or a ridge waveguide. The shape of the closed loop may be e.g. a ring shape, an oval shape, an elliptical shape, or a polygon shape. FIG. 4 illustrates coupling loop resonators 66 with ring shapes. As an alternative to a strip waveguide or a ridge waveguide forming the coupling loop resonator 66, a slab waveguide may be used, the slab waveguide may form a disc (e.g., a microdisc), which presents closed loop light paths in the form of whispering gallery modes. As a further alternative, a sphere, e.g. a microsphere, may be used to form the coupling loop resonator 66.

Each loop reflector 62 in FIG. 4 further comprises an intensity modulator 31 configured to modulate the intensity of the light field that is reflected back into the bus waveguide 20. Thus, the reflectivity of the light loop reflector 62 may be modulated to form part of the first 8a or second 8b power modulation pulse.

The intensity modulator 31 of the loop reflector optical modulator part 60 may be an EA modulator or an optical amplifier, e.g. a SOA, connected to or being a part of the coupling loop resonator 66. Thus, the light field within the coupling loop resonator 66 may be attenuated or amplified such that the reflectivity of the loop reflector 62 may be modulated. Alternatively, the intensity modulator 31 of the loop reflector optical modulator part 60 may be an EO modulator connected to or being a part of the inter loop resonator 66. The EO modulator may change the refractive index of a part of the coupling loop resonator 66. Thus, the reflection spectrum of the loop reflector 62 may be shifted.

A loop reflector optical modulator part 60 may operate analogously to a Bragg reflector optical modulator part 50.

FIG. 5 illustrates a laser 1 wherein the optical power modulating unit 30 comprises two bypass waveguide reflector optical modulator parts 70. In FIG. 5, one bypass waveguide reflector optical modulator part 70 comprises a bus bypass waveguide reflector 72 at the first end 21 of the bus waveguide 20. The other bypass waveguide reflector optical modulator part 70 comprises a bus bypass waveguide reflector 72 at the second end 22 of the bus waveguide 20.

In the following, the function of the bypass waveguide reflector optical modulator part 70 at the first end 21 of the bus waveguide 20 in FIG. 5 will be described.

The illustrated bus bypass waveguide reflector 72 at the first end 21 of the bus waveguide 20 is a waveguide with two ends, one end adjacent to a first point of the bus waveguide 20 and another end adjacent to a second point of the bus waveguide 20. The two ends of the illustrated bus bypass waveguide reflector 72 point in the same direction of the bus waveguide 20. In this case of the bus bypass waveguide reflector 72 at the first end 21, the two ends point along the bus waveguide 20, towards the second end 22 of the bus waveguide 20. In the illustrated bus bypass waveguide reflector 72 at the first end 21 both ends of the bus bypass waveguide reflector 72 are close enough to the bus waveguide 20 to be optically coupled to the bus waveguide 20 by evanescent wave coupling. Thus, the bypass waveguide reflector optical modulator part 70 at the first end 21 comprises a bus bypass waveguide reflector 72 configured to receive a light field travelling in a first direction of the bus waveguide 20, the first direction being towards the first end 21 of the bus waveguide 20. The bus bypass waveguide reflector 72 at the first end 21 is further configured to deliver at least part of the received light field back into the bus waveguide 20 in a direction opposite to the first direction (i.e., travelling towards the second end 22 of the bus waveguide 20). In the illustrated bypass waveguide reflector optical modulator part 70 at the first end 21, the light field travelling in the bus waveguide 20 towards the first end 21 may be received at either end of the bus bypass waveguide reflector 72 and delivered back to the bus waveguide 20 at the opposite end of the bus bypass waveguide reflector 72 as a light field travelling in the bus waveguide 20 towards the second end 22. Light may of course be received at both ends of the bus bypass waveguide reflector 72 simultaneously and delivered at both ends of the bus bypass waveguide reflector 72 simultaneously.

Above, the illustrated bus bypass waveguide reflector 72 at the first end 21 of the bus waveguide 20 has been described. The illustrated bus bypass waveguide reflector 72 at the second end 22 of the bus waveguide 20 may be described analogously, the difference being that the bus bypass waveguide reflector 72 at the second end 22 of the bus waveguide 20 is configured to receive a light field travelling in the bus waveguide 20 towards the second end 22 of the bus waveguide 20 and deliver at least part of the received light field back into the bus waveguide 20 travelling towards the first end 21 of the bus waveguide 20.

Each bypass waveguide reflector optical modulator part 70 of FIG. 5 further comprise an intensity modulator 31 configured to modulate an intensity of the reflected part of the light field, such that a reflectivity of the bus bypass waveguide reflector 72 is modulated. The intensity modulator 31 may be an EA modulator or an optical amplifier (e.g., a SOA) connected to or being a part of the waveguide that is the bus bypass waveguide reflector 72. Thus, the light field within the bus bypass waveguide reflector 72 may be attenuated or amplified such that the reflectivity of the bus bypass waveguide reflector 72 may be modulated.

In the embodiments of FIGS. 2-5 described above, the optical power modulating unit 30 may generate the first 8a and second 8b power modulation pulse by increasing a reflectivity of the reflector at one end 21, 22 of the bus waveguide 20 and decreasing a reflectivity of the reflector at the other end 22, 21 of the bus waveguide 20. If for example the optical gain medium forms the loop resonator 2 and the bus waveguide 20 is optically coupled to the loop resonator 2 at a point midway between the reflector at the first end 21 of the bus waveguide 20 and the reflector at the second end 22 of the bus waveguide 20, the reflectivity of the reflector at the first 21 and second 22 end of the bus waveguide 20 may be changed by an equal amount and opposite signs. The laser 1 may be configured such that the change in reflectivity is simultaneous (e.g., by increasing the electric field of an EA intensity modulator 31 associated with the reflector at the first end 21 of the bus waveguide 20 and simultaneously decreasing the electric field of an EA intensity modulator 31 associated with the reflector at the second end 22 of the bus waveguide 20). If the bus waveguide 20 is optically coupled to the loop resonator 2 at a point which is not midway between the reflector at the first end 21 of the bus waveguide 20 and the reflector at the second end 22 of the bus waveguide 20, the laser 1 may be configured such that the change in reflectivity is not simultaneous. Instead the laser may be configured such that the optical power of the CW mode and the CCW mode changes simultaneously in the optical gain medium of the loop resonator 2.

Figure 6:
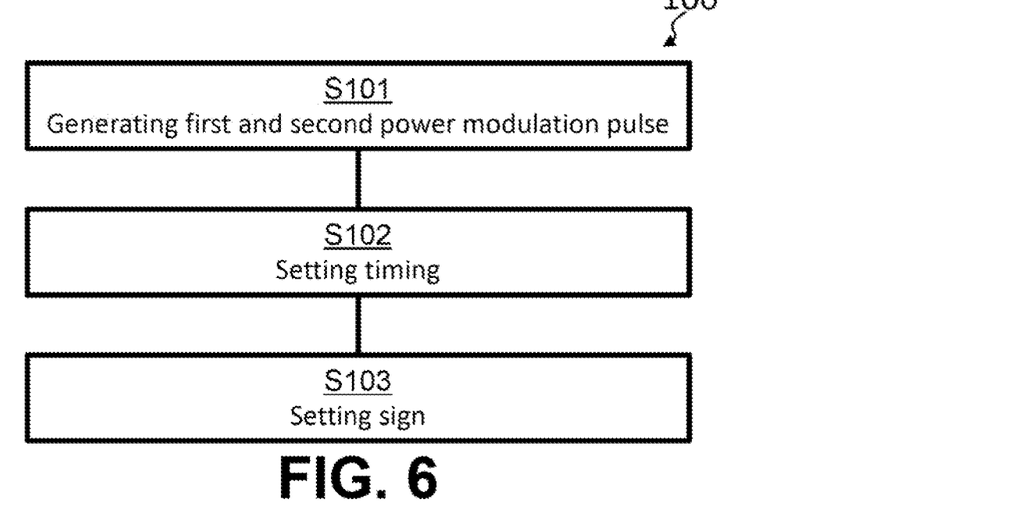
FIG. 6 illustrates a flowchart of a method, according to example embodiments.

FIG. 6 illustrates a flow chart of a method 100 for creating a laser pulse from a laser 1. The method comprises the steps S101, S102 and S103.

According to the method 100 the first 8a and second 8b power modulation pulse is generated in step S101 by the optical power modulating unit 30. Further, according to the method when generating the first 8a and second (8b) power modulation pulse the timing of the first 8a' and second 8b power modulation pulse is set S102 such that the first 8a and second 8b power modulation pulse, at least partially, overlap in time, and the sign of the change in optical power of the first power modulation pulse 8a is set S103 opposite to the sign of the change in optical power of the second power modulation pulse 8b.

In the above, embodiments have mainly been described with reference to a limited number of examples. However, as is readily appreciated by a person skilled in the art, other examples than the ones disclosed above are equally possible within the scope of the disclosure, as defined by the appended claims.

What is claimed is:

1. A laser comprising:
  a loop resonator forming a closed loop light path, wherein the loop resonator comprises an optical gain medium configured to lase, and wherein the loop resonator is configured to, during lasing, present a pair of modes:
    a mode of light propagating in a clockwise direction in the closed loop light path of the loop resonator, termed CW mode; and
    a mode of light propagating in a counter-clockwise direction in the closed loop light path of the loop resonator, termed CCW mode;
  a first light output configured to output laser light front the laser; and
  an optical power modulating unit configured to modulate:
    an optical power of the CW mode of the loop resonator; and
    an optical power of the CCW mode of the loop resonator,
  wherein the laser is configured to create a laser pulse at the first light output by generating, by the optical power modulating unit:
    a first power modulation pulse, wherein the first power modulation pulse is a change in optical power of the CW mode of the loop resonator, and wherein the change in optical power of the CW mode of the loop resonator has a positive or negative sign; and
    a second power modulation pulse, wherein the second power modulation pulse is a change in optical power of the CCW mode of the loop resonator, and wherein the change in optical power of the CCW mode of the loop resonator has a positive or negative sign, and
  wherein the laser is further configured to when generating the first power modulation pulse and the second power modulation pulse:
    set a timing of the first power modulation pulse and a timing of the second power modulation pulse such that the first power modulation pulse and the second power modulation pulse at least partially overlap in time, and
    set the sign of the change in optical power of the first power modulation pulse opposite to the sign of the change in optical power of the second power modulation pulse,
  whereby a change in a total optical power in the loop resonator is mitigated and a chirp of the laser pulse is reduced.

2. The laser of claim 1, wherein the laser is further configured to set a ratio between a magnitude of the change in optical power of the first power modulation pulse and a magnitude of the change in optical power of the second power modulation pulse to a value between 0.25 and 4.

3. The laser of claim 1, wherein the laser is further configured to prevent the total optical power in the loop resonator from changing by more than 50% during a time period comprising the first power modulation pulse and the second power modulation pulse.

4. The laser of claim 1, wherein the laser is further configured to prevent a population inversion of the optical gain medium of the loop resonator from changing by more than 50% during a time period comprising the first power modulation pulse and the second power modulation pulse.

5. The laser of claim 1, wherein the laser is further configured to generate the first power modulation pulse and the second power modulation pulse by modulating a coupling coefficient of the laser, and wherein the coupling coefficient represents a transfer rate of power from one mode of the pair of modes to the other mode of the pair of modes.

6. The laser of claim 1, wherein the optical power modulating unit comprises a bypass waveguide optical modulator part comprising:
   a loop resonator bypass waveguide, wherein the loop resonator bypass waveguide is a waveguide configured to:
      receive a light field from one mode of the pair of modes of the loop resonator at a first point of the loop resonator;
      guide the light field; and
      deliver at least part of the light field into the other mode of the pair of modes of the loop resonator at a second point of the loop resonator, wherein the delivered light field thereby bypasses a part of the loop resonator between the first point of the loop resonator and the second point of the loop resonator; and
   an intensity modulator configured to modulate an intensity of the light field guided by the loop resonator bypass waveguide such that an intensity of the light field delivered by the loop resonator bypass waveguide at the second point of the loop resonator is modulated to form at least part of the first power modulation pulse or the second power modulation pulse.

7. The laser of claim 6,
   wherein the optical power modulating unit further comprises a first bypass waveguide optical modulator part and a second bypass waveguide optical modulator part,
   wherein the received light field of the loop resonator bypass waveguide of the first bypass waveguide optical modulator part is a CW mode light field, and
   wherein the received light field of the loop resonator bypass waveguide of the second bypass waveguide optical modulator part is a CCW mode light field.

8. The laser of claim 1, further comprising a bus waveguide with a first end and a second end, wherein the bus waveguide is optically coupled to the loop resonator at a point between the first end and second end, and wherein the bus waveguide is configured to guide laser light from the loop resonator.

9. The laser of claim 8, wherein the laser comprises a reflector at the first end of the bus waveguide and a reflector at the second end of the bus waveguide, and wherein the reflector at the first end of the bus waveguide and the reflector at the second end of the bus waveguide are configured to reflect part of a light field from the bus waveguide back into the bus waveguide.

10. The laser of claim 9, wherein the optical power modulating unit is configured to generate the first power modulation pulse and the second power modulation pulse by increasing a reflectivity of the reflector at one end of the bus waveguide and decreasing a reflectivity of the reflector at the other end of the bus waveguide.

11. The laser of claim 9, wherein the optical power modulating unit comprises a Bragg reflector optical modulator part comprising:
   a Bragg reflector at the first of the bus waveguide or the second end of the bus waveguide, wherein the Bragg reflector is configured to reflect part of a light field from the bus waveguide back into the bus waveguide; and
   an intensity modulator configured to modulate an intensity of the reflected part of the light field such that a reflectivity of the Bragg reflector is modulated to form part of the first power modulation pulse or the second power modulation pulse.

12. The laser of claim 9, wherein the optical power modulating unit comprises a loop reflector optical modulator part comprising:
   a loop reflector at the first end of the bus waveguide or the second end of the bus waveguide, wherein the loop reflector comprises:
      a waveguide splitter;
      a first waveguide;
      a second waveguide; and
      a coupling loop resonator,
      wherein the waveguide splitter is configured to split light from the bus waveguide into the first waveguide and the second waveguide,
      wherein the coupling loop resonator forms a closed loop light path, and
      wherein the coupling loop resonator is configured to optically couple to both the first waveguide and the second waveguide such that:
         a part of a light field leaving the bus waveguide via the first waveguide is coupled back into the into bus waveguide via the coupling loop resonator and the second waveguide; and
         a part of the light field leaving the bus waveguide via the second waveguide is coupled back into the into bus waveguide via the coupling loop resonator and the first waveguide,
   wherein the loop reflector is thereby configured to reflect part of the light field from the bits waveguide back into the bus waveguide, and
   wherein the loop reflector optical modulator part further comprises an intensity modulator configured to modulate an intensity of the reflected part of the light field such that a reflectivity of the loop reflector is modulated to form part of the first power modulation pulse or the second power modulation pulse.

13. The laser of claim 9, wherein the optical power modulating unit comprises a bypass waveguide reflector optical modulator part comprising:
   a bus bypass waveguide reflector at the first end or the second end of the bus waveguide, wherein the bus bypass waveguide reflector is a waveguide configured to:
      receive a light field travelling in a first direction of the bus waveguide at a first point of the bus waveguide;
      guide the light field; and
      deliver at least part of the light field back into the bus waveguide travelling in a second direction of the bus waveguide, at a second point of the bus waveguide, wherein the delivered light field thereby bypasses a part of the bus waveguide between the first point and the second point of the bus waveguide, and wherein the bus bypass waveguide reflector is thereby configured to reflect part of a light field from the bus waveguide back into the bus waveguide; and an intensity modulator configured to modulate an intensity of the reflected part of the light field such that a reflectivity of the bus bypass waveguide reflector is modulated to form part of the first power modulation pulse or the second power modulation pulse.

14. The laser of claim 1, wherein the optical power modulating unit comprises:
   a first optical modulator configured to modulate the optical power of the CW mode of the loop resonator; and
   a second optical modulator configured to modulate the optical power of the CCW mode of the loop resonator.

15. A method for creating a laser pulse from a laser, wherein the laser comprises:
   a loop resonator forming a closed loop light path, wherein the loop resonator comprises an optical gain medium configured to lase, and wherein the loop resonator is configured to, during lasing, present a pair of modes:
      a mode of light propagating in a clockwise direction in the closed loop light path of the loop resonator termed CW mode; and
      a mode of light propagating in a counter-clockwise direction in the closed loop light path of the loop resonator, termed CCW mode;
   a first light output, configured to output laser light from the laser; and
   an optical power modulating unit configured to modulate:
      an optical power of the CW mode of the loop resonator; and
      an optical power of the CCW mode of the loop resonator,
   wherein the method comprises:
      generating, by the optical power modulating unit:
         a first power modulation pulse, wherein the power modulating pulse is a change in optical power of the CW mode of the loop resonator, and wherein the change in optical power of the CW mode of the loop resonator has a positive or negative sign; and
         a second power modulation pulse, wherein the second power modulation pulse is a change in optical power of the CCW mode of the loop resonator, and wherein the change in optical power of the CCW mode of the loop resonator has a positive or negative sign, and
      when generating the first power modulation pulse and the second power modulation pulse, setting a timing of the first power modulation pulse and the second power modulation pulse such that the first power modulation pulse and the second power modulation pulse at least partially overlap in time; and
      setting the sign of the change in optical power of the first power modulation pulse opposite to the sign of the change in optical power of the second power modulation pulse,
   whereby the laser pulse is created by the laser at the first light output while a change in a total optical power in the loop resonator is mitigated and a chirp of the laser pulse is reduced.

16. The method of claim 15, further comprising setting a ratio between a magnitude of the change in optical power of the first power modulation pulse and a magnitude of the change in optical power of the second power modulation pulse to a value between 0.25 and 4.

17. The method of claim 15, further comprising preventing the total optical power in the loop resonator from changing by more than 50% during a time period comprising the first power modulation pulse and the second power modulation pulse.

18. The method of claim 15, further comprising preventing a population inversion of the optical gain medium of the loop resonator from changing by more than 50% during a time period comprising the first power modulation pulse and the second power modulation pulse.

19. The method of claim 15, further comprising generating the first power modulation pulse and the second power modulation pulse by modulating a coupling coefficient of the laser, wherein the coupling coefficient represents a transfer rate of power from one mode of the pair of modes to the other mode of the pair of modes.

20. The method of claim 15, wherein the laser further comprises a bus waveguide with a first end and a second end, wherein the bus waveguide is optically coupled to the loop resonator at a point between the first end and second end, and wherein the bus waveguide is configured to guide laser light from the loop resonator.

* * * * *